United States Patent
Ishigami et al.

(10) Patent No.: US 6,329,275 B1
(45) Date of Patent: Dec. 11, 2001

(54) INTERCONNECTOR LINE OF THIN FILM, SPUTTER TARGET FOR FORMING THE WIRING FILM AND ELECTRONIC COMPONENT USING THE SAME

(75) Inventors: Takashi Ishigami; Koichi Watanabe; Akihisa Nitta; Toshihiro Maki; Noriaki Yagi, all of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/051,567
(22) PCT Filed: Oct. 14, 1996
(86) PCT No.: PCT/JP96/02961
  § 371 Date: Apr. 10, 1998
  § 102(e) Date: Apr. 10, 1998
(87) PCT Pub. No.: WO97/13885
  PCT Pub. Date: Apr. 17, 1997

(30) Foreign Application Priority Data

Oct. 12, 1995 (JP) .................................................. P7-264472

(51) Int. Cl.$^7$ .................................................. H01L 21/20
(52) U.S. Cl. ........................................... 438/584; 438/128
(58) Field of Search ..................................... 257/770, 771; 438/128, 584, 597, 680

(56) References Cited

U.S. PATENT DOCUMENTS 4,302,498  11/1981  Faith, Jr. .

5,367,179  11/1994  Mori et al. .
5,514,909  5/1996  Yamamoto et al. .

FOREIGN PATENT DOCUMENTS

| 3911657 | 10/1990 | (DE) . |
|---|---|---|
| 0 542 271 A2 | 5/1993 | (EP) . |
| 62-228446 | 10/1987 | (JP) . |
| 62-235454 | 10/1987 | (JP) . |
| 62-240738 | 10/1987 | (JP) . |
| 4-48854 | 8/1992 | (JP) . |
| 5-171434 | 7/1993 | (JP) . |
| 5-239635 | 9/1993 | (JP) . |
| 7-45555 | 2/1995 | (JP) . |

OTHER PUBLICATIONS

Copy of European Search Report dated 8/16/99.

Primary Examiner—Roy Potter
(74) Attorney, Agent, or Firm—Finnegan, Henderson, Farabow, Garrett & Dunner, L.L.P.

(57) ABSTRACT

An interconnector line of thin film comprising 0.001 to 30 at % of at least one kind of a first element capable of constituting an intermetallic compound of aluminum and/or having a higher standard electrode potential than aluminum, for example, at least one kind of the first element selected from Y, Sc, La, Ce, Nd, Sm, Gd, Tb, Dy, Er, Th, Sr, Ti, Zr, V, Nb, Ta, Cr, Mo, W, Mn, Tc, Re, Fe, Co, Ni, Pd, Ir, Pt, Cu, Ag, Au, Cd, Si, Pb and B; and one kind of a second element selected from C, O, N and H in a proportion of 0.01 at ppm to 50 at % of the first element, with the balance comprising substantially Al. In addition to having low resistance, such an Al interconnector line of thin film can prevent the occurrence of hillocks and the electrochemical reaction with an ITO electrode. The interconnector line of thin film can be obtained by sputtering in a dust-free manner by using a sputter target having a similar composition.

6 Claims, 5 Drawing Sheets

INTERCONNECTOR LINE OF THIN FILM, SPUTTER TARGET FOR FORMING THE WIRING FILM AND ELECTRONIC COMPONENT USING THE SAME

TECHNICAL FIELD

The invention relates to an interconnector line of thin film suitable for forming low-resistance interconnector line, a sputter target for forming an interconnector line of thin film and electronic parts such as a liquid crystal display (LCD) and a semiconductor device applying the low-resistance interconnector line.

BACKGROUND ART

An interconnector line of thin film used as a gate line and a source electrode bus-line for a TFT drive type LCD is generally produced by a sputtering method. As materials for such an interconnector line of thin film, Cr, Ti, Mo, Mo—Ta and the like have been used. But, with the enlargement of an LCD screen size, a low-resistance interconnector line of thin film is being needed. For example, a large LCD of 10 inches or more is required to have a low resistant interconnector line of 10 $\mu\Omega$cm or below. Accordingly, a low-resistance Al is attracting attention as an interconnector line of thin film for a gate line, a signal line and the like.

With the Al interconnector line of thin film, low-resistance interconnector line can be achieved, but the Al interconnector line of thin film has a problem of having protrusions called hillocks due to heating at about 473 to 773K by a heat treatment and a CVD process after interconnector line. In a process of releasing a stress of the Al film involved in heating, Al atoms spread along, for example, grain boundaries. Protrusions (hillocks) are caused involved in the spreading of Al atoms. When the protrusions are formed on the Al interconnector line, an adverse effect is caused in the subsequent process.

Therefore, it is attempted to add a very small amount of metallic elements, e.g., Fe, Co, Ni, Ru, Rh and Ir or rare earth metallic elements such as Y, La and Nd (see Japanese Patent Application Laid-Open Publication No. Hei 7-45555). Specifically, an Al interconnector line of thin film is formed using an Al target having a very small amount of such metallic elements added. The above-described metallic elements form an intermetallic compound in cooperation with Al and function as a trap material for Al. Thus, the above-described hillocks can be restrained from being occurred.

And, where the Al interconnector line is applied to source electrode bus-lines of the LCD, the Al interconnector line is stacked with an ITO electrode. When the stacked film of the Al interconnector line and the ITO electrode is immersed in an alkali solution such as a developing solution used in a patterning process, an electrochemical reaction is caused at portions where the Al interconnector line and the ITO electrode are directly contacted. The electrochemical reaction between the Al interconnector line and the ITO electrode is caused because the standard electrode potential of Al is lower than that of the ITO. Electrons are moved between the Al interconnector line and the ITO electrode due to the electrochemical reaction, resulting in a problem that the ITO electrode is colored (e.g., blackening) by being reduced and the Al interconnector line is conversely oxidized to lower electrical characteristics.

In connection with the problem due to the electrochemical reaction between the Al interconnector line and the ITO electrode described above, it is also studied to add various types of metallic elements to the Al interconnector line. In such a case, the Al target with an very small amount of metallic elements added is also used to form the Al interconnector line of thin film containing a very small amount of metallic elements.

However, the above-described Al interconnector line of thin film containing a very small amount of metallic elements suppress the diffusion of Al and the electrochemical reaction with the ITO electrode, but there are problems that the produced intermetallic compound and the added metallic elements cause an adverse effect on the etching property and sputtering property of the Al interconnector line.

Specifically, when dry etching such as CDE (chemical dry etching) and RIE (reactive ion etching) or wet etching is made on the above-described Al interconnector line of thin film, a lot of undissolved remains called residues are produced, causing a serious difficulty in forming an interconnector line network. The added metallic elements and the produced intermetallic compounds are the causes of the residues after etching as described above. And, the Al target containing the metallic elements described above causes a large amount of dust while sputtering, causing a difficulty in forming a good and fine interconnector line network.

Therefore, in the Al target and Al interconnector line of thin film used to form low-resistance interconnector line, it is a subject to restrain the occurrence of residues in etching and the occurrence of dust in sputtering in addition to suppression of the occurrence of hillocks due to the diffusion of Al and the electrochemical reaction with the ITO electrode.

And, in connection with the suppression of the electrochemical reaction between the Al interconnector line and the ITO electrode, it is desired to improve an effect upon reducing the added amount of electrical elements. The electrochemical reaction between the Al interconnector line and the ITO electrode is also studied to be suppressed by having a stacked structure of the Al interconnector line and an Mo film or the like. But, such a stacked film involves a complex LCD structure and a high cost, so that it is desired to suppress the electrochemical reaction with the ITO electrode by the Al interconnector line having a single layered structure.

The above-described subject is not limited to the Al interconnector line of thin film used for the gate line and signal line of the LCD. For example, where the Al interconnector line is applied to a typical semiconductor device such as VLSI and ULSI, electromigration is a problem. The above-described metallic elements have an effect to suppress the electromigration (see Japanese Patent Application Laid-Open Publication No. Sho 62-228446 and Japanese Patent Publication No. Hei 4-48854), but there is a problem that residues are caused in etching and dust is caused in sputtering as in the case of the LCD. And, the above-described subject is also an issue in a surface acoustic wave apparatus such as a surface acoustic wave oscillator (SAW), an electronic part using SAW (SAW device), or interconnector line and electrodes for a thermal printer head (TPH).

An object of the invention is to provide a low-resistance interconnector line of thin film with the occurrence of hillocks and etching residues prevented and a sputter target which can form the interconnector line of thin film with good reproducibility with the occurrence of dust in sputtering suppressed. Another object of the invention is to provide a low-resistance interconnector line of thin film which has the electrochemical reaction with the ITO or the like and the occurrence of the etching residues prevented and a sputter target with the occurrence of dust in sputtering suppressed. Besides, it aims to provide an electronic part using such a interconnector line of thin film.

DISCLOSURE OF THE INVENTION

A first interconnector line of thin film of the invention comprises 0.001 to 30 at % of at least one type of first element constituting an intermetallic compound of Al and 0.01 at ppm to 50 at % of at least one type of second element selected from C, O, N and H with respect to the amount of the first element, with the balance comprising substantially Al.

A second interconnector line of thin film of the invention comprises 0.001 to 30 at % of at least one type of first element having a standard electrode potential higher than Al and 0.01 at ppm to 50 at % of at least one type of second element selected from C, O, N and H with respect to the amount of the first element, with the balance comprising substantially Al.

Another interconnector line of thin film of the invention comprises 0.001 to 30 at % of at least one type of first element selected from Y, Sc, La, Ce, Nd, Sm, Gd, Tb, Dy, Er, Th, Sr, Ti, Zr, V, Nb, Ta, Cr, Mo, W, Mn, Tc, Re, Fe, Co, Ni, Pd, Ir, Pt, Cu, Ag, Au, Cd, Si, Pb and B and 0.01 at ppm to 50 at % of at least one type of second element selected from C, O, N and H with respect to the amount of the first element, with the balance comprising substantially Al.

And, a first sputter target of the invention comprises 0.001 to 30 at % of at least one type of first element constituting an intermetallic compound of Al and 0.01 at ppm to 50 at % of at least one type of second element selected from C, O, N and H with respect to the amount of the first element, with the balance comprising substantially Al.

A second sputter target of the invention comprises 0.001 to 30 at % of at least one type of first element having a standard electrode potential higher than Al and 0.01 at ppm to 50 at % of at least one type of second element selected from C, O, N and H with respect to the amount of the first element, with the balance comprising substantially Al.

Another sputter target of the invention comprises 0.001 to 30 at % of at least one type of first element selected from Y, Sc, La, Ce, Nd, Sm, Gd, Tb, Dy, Er, Th, Sr, Ti, Zr, V, Nb, Ta, Cr, Mo, W, Mn, Tc, Re, Fe, Co, Ni, Pd, Ir, Pt, Cu, Ag, Au, Cd, Si, Pb and B and 0.01 at ppm to 50 at % of at least one type of second element selected from C, O, N and H with respect to the amount of the first element, with the balance comprising substantially Al.

And, an electronic part of the invention is characterized by having the interconnector line of thin film of the invention.

To an Al sputter target, a very small amount of at least one type of element selected from C, O, N and H is added together with an element such as Y (hereinafter described as the intermetallic compound forming element) constituting an intermetallic compound with Al or an element such as Au (hereinafter described as the high electrode potential element) having a standard electrode potential higher than Al. By these elements, an intermetallic compound, intermetallic compound forming element and high electrode potential element which exist in the obtained sputter film and are poor in etching workability are finely and uniformly precipitated in Al grains and grain boundaries.

Thus, by finely and uniformly precipitating the intermetallic compound, intermetallic compound forming element and high electrode potential electrode, the etching property is improved extensively, and the occurrence of dust in sputtering can be suppressed. And, at least one type of element selected from the added C, O, N and H does not cause an adverse effect on the effect of suppressing the diffusion of Al or the effect of suppressing the electrochemical reaction with ITO or the like. Therefore, the occurrence of hillocks can be prevented effectively by the intermetallic compound-forming element. Otherwise, the electrochemical reaction with the ITO or the like can be prevented effectively by the high electrode potential element.

As described above, the first interconnector line of thin film of the invention excels in hillock resistance and formability of a fine interconnector line network. And, the second interconnector line of thin film of the invention excels in preventing property of the electrochemical reaction with the ITO or the like and formability of the fine interconnector line network. The interconnector line of thin film of the invention can concurrently have such properties.

EMBODIMENTS FOR CARRYING OUT THE INVENTION

Figure 1:
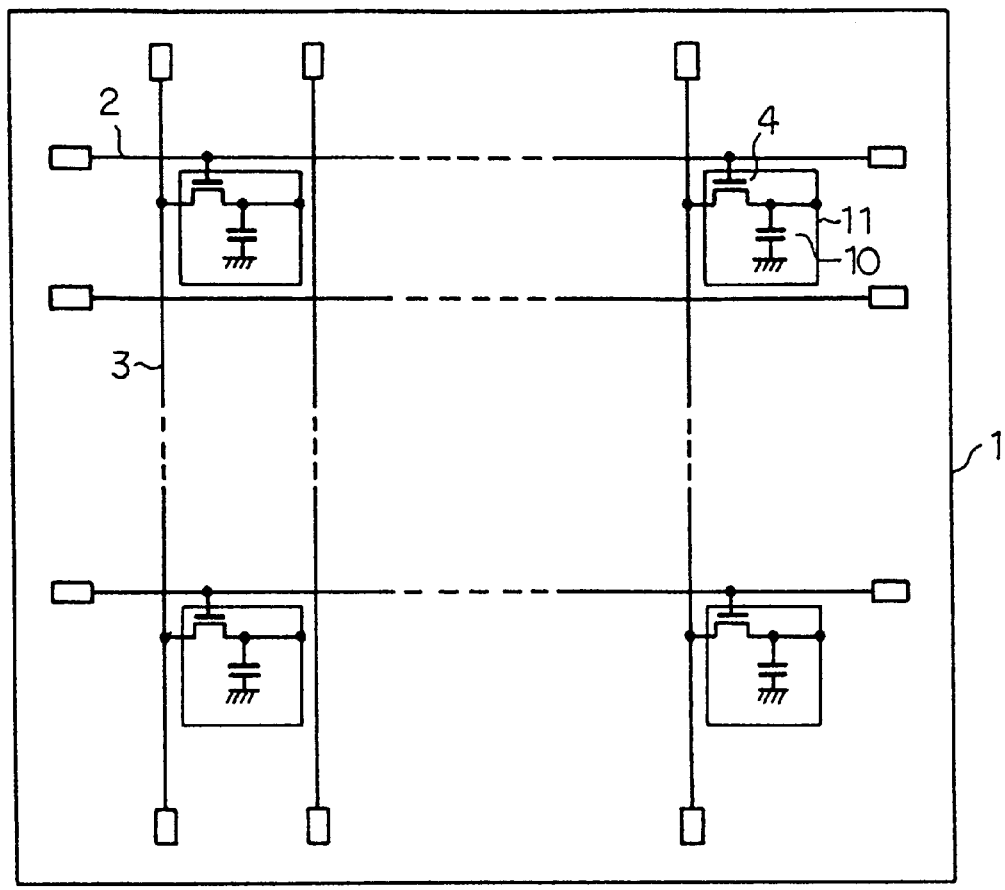
FIG. 1 is an equivalent circuit diagram of an embodiment having an electronic part of the invention applied to a liquid crystal display.

Embodiments for carrying out the invention will be described below.

A first interconnector line of thin film of the invention contains 0.001 to 30 at % of at least one type of first element constituting an intermetallic compound with Al and 0.01 at ppm to 50 at % with respect to the amount of the first element of at least one type of second element selected from C, O, N and H, with the balance comprising substantially Al.

The above-described first element can be various types of elements if they constitute an intermetallic compound with Al. Specifically, they can be rare earth metallic elements such as Y, Sc, La, Ce, Nd, Sm, Gd, Tb, Dy, Er, Gd and the like, Nb, Ta, Re, Mo, W, Zr, Hf and the like.

These elements (intermetallic compound forming elements) constituting the intermetallic compound with Al form, for example, an intermetallic compound such as $Al_3Y$ and function as a trap material for Al. Therefore, the diffusion of Al can be suppressed when thermal treatment is applied to an Al interconnector line of thin film or when the Al interconnector line of thin film is formed at a relatively high temperature. As a result, the occurrence of hillocks is prevented. And, electromigration and the like can also be suppressed.

The intermetallic compound forming elements used are preferred to have a solid solubility of 1.0 wt % or below with respect to Al. If the solid solubility with respect to Al exceeds 1.0 wt %, a sufficient effect of suppressing hillocks owing to the constitution of an intermetallic compound with Al might not be attained, and specific resistance might increase. Such intermetallic compound forming elements are Ge, Li, Mg, Th, Ti, V, Zn, W and others.

And, a second interconnector line of thin film of the invention contains 0.001 to 30 at % of at least one type of first element having a standard electrode potential higher than that of Al and 0.01 at ppm to 50 at % with respect to the amount of the first element of at least one type of second element selected from C, O, N and H, with the balance comprising substantially Al.

The above-described first element of the second interconnector line of thin film can be various types of elements if they have a standard electrode potential higher than that of Al. Specifically, they can be Ag, Au, Cu, Ti, V, Nb, Ta, Cr, Mo, W, Mn, Fe, Co, Ni, Pd, Ir, Pt, Cd, Si, Pb and the like. Among them, Ag, Au, Co, Cu, Mo, W and Mn having a standard electrode potential higher by 2V (298K) or more from that of Al are preferably used in particular.

These elements (high electrode potential elements) having a higher standard electrode potential than Al can be contained in the Al interconnector line of thin film to raise a standard electrode potential of the Al interconnector line of thin film. The electrochemical reaction occurring between the Al interconnector line of thin film and the ITO electrode in an alkaline solution is a phenomenon which occurs owing to the movement of electrons because Al has a standard electrode potential lower than that of ITO. Therefore, by containing the high electrode potential elements into the Al interconnector line of thin film to increase the standard electrode potential of the Al interconnector line of thin film to exceed that of, for example, ITO, an electrochemical reaction between the Al interconnector line of thin film and the ITO electrode in the alkaline solution can be prevented. Thus, the gate line of, for example, LCD can be formed well with the Al interconnector line of thin film having a single layer structure without degrading the electrical characteristics due to coloring by reduction of the ITO electrode and oxidation of the Al interconnector line of thin film.

Improvement of the standard electrode potential of the Al interconnector line of thin film by addition of the high electrode potential elements is effective not only when it is laminated with the ITO electrode but also when the Al interconnector line of thin film is laminated with an electrode, interconnector line and the like made of various types of materials having a standard electrode potential which is higher than that of Al.

The above-described high electrode potential elements are preferably elements, which form an intermetallic compound with Al to suppress the specific resistance of the Al interconnector line of thin film from increasing. And, by using the elements constituting the intermetallic compound with Al as the high electrode potential element, the occurrence of hillocks and the electromigration can also be suppressed as described above. Thus, the elements, which have a standard electrode potential higher than that of Al and constitute an intermetallic compound with Al, are particularly effective. The Al interconnector line of thin film containing such elements can be used satisfactorily for either the signal line or the gate line of LCD and can be said having high general-purpose properties. Such elements are Pd, V, Ni, Mo, W and Co.

The interconnector line of thin film of the invention comprises 0.001 to 50 at % of at least one type of the first element (element satisfying at least one of an intermetallic compound forming element and a high electrode potential element) selected from Y, Sc, La, Ce, Nd, Sm, Gd, Tb, Dy, Er, Th, Sr, Ti, Zr, V, Nb, Ta, Cr, Mo, W, Mn, Tc, Re, Fe, Co, Ni, Pd, Ir, Pt, Cu, Ag, Au, Cd, Si, Pb and B and 0.01 at ppm to 50 at % with respect to the amount of the first element of at least one type of second element selected from C, O, N and H, with the balance comprising substantially Al.

The above-described intermetallic compound forming element and high electrode potential element are contained in a range of 0.001 to 30 at % into the Al interconnector line of thin film. For example, if the intermetallic compound forming element is contained in an amount of less than 0.001 at %, the above-described hillock suppressing effect cannot be obtained satisfactorily. On the other hand, if it exceeds 30 at %, the intermetallic compound increases the resistance of the Al interconnector line of thin film and also becomes the cause of producing residues in dry etching or wet etching. And, if the high electrode potential element is contained in an amount of less than 0.1 at %, the above-described electrochemical reaction suppressing effect cannot be obtained satisfactorily. And, if it exceeds 20 at %, the resistance of the Al interconnector line of thin film is increased, and residues are produced in dry etching or wet etching. A more preferable adding amount is in a range of 0.1 to 20 at %.

As described above, the interconnector line of thin film of the invention has a very small amount of at least one type of element selected from C, O, N and H contained together with an element which satisfies at least either the intermetallic compound forming element or the high electrode potential element. This element (C, O, N, H) contained in a very small amount effectively acts on precipitation of a very small amount of the intermetallic compound, or the intermetallic compound forming element and the high electrode potential element itself. Therefore, the intermetallic compound, the intermetallic compound forming element and the high electrode potential element in the Al interconnector line of thin film can be precipitated finely and uniformly in the Al grains and grain boundaries.

Thus, by finely and uniformly precipitating the intermetallic compound, the intermetallic compound forming element and the high electrode potential element in the Al interconnector line of thin film, the etching property is improved extensively. Therefore, when the interconnector line network is formed on the Al interconnector line of thin film by dry etching or the like, the occurrence of etching residues can be suppressed substantially. And, as described in detail afterward, when the sputtering method is applied to produce the Al interconnector line of thin film of the present invention, at least one type of element selected from C, O, N and H is also effective to suppress the produced amount of dust by sputtering. Therefore, the Al interconnector line of thin film with the content of fine dust reduced substantially can be obtained.

And, the diffusion of Al involved in heating by the heat treatment is suppressed by the formation of the intermetallic compound between the intermetallic compound forming element and Al as described above, and as a result, the occurrence of hillocks can be prevented effectively. Therefore, the first Al interconnector line of thin film of the invention excels in hillock resistance, does not cause an adverse effect on the subsequent process due to the occurrence of hillocks, and excels in forming a fine interconnector line network. And, an electrochemical reaction with the ITO electrode or the like in an alkaline solution is suppressed by containing therein the high electrode potential element. Accordingly, the second Al interconnector line of thin film of the invention excels in preventing the electrochemical reaction with the ITO electrode or the like and in forming the fine interconnector line network.

The contained amount of at least one type of element (hereinafter referred to as fine precipitating element) selected from C, O, N and H as described above shall be in a range of 0.01 at ppm to 50 at % with respect to an amount of the intermetallic compound forming element or the high electrode potential element in the Al interconnector line of thin film. When the contained amount of the fine precipitating element is less than 0.01 at ppm with respect to the amount of the intermetallic compound forming element or the high electrode potential element, the fine precipitating effect of the intermetallic compound, the intermetallic compound forming element or the high electrode potential element can not be obtained satisfactorily. On the other hand, if it exceeds 50 at %, an excess C, H or the like is precipitated on the Al grain boundaries or in the grains, lowering the etching property.

A more preferable contained amount of the fine precipitating element is in a range of 3 at ppm to 3 at % when C is used, and 1.5 at ppm to 7.5 at % when O, N and H are used. When C is used as the fine precipitating element, it is more preferable that it is in a range of 300 to 3000 at ppm with respect to the intermetallic compound forming element or the high electrode potential element, and desirably in a range of 600 to 1500 at ppm. When O, N and H are used as the fine precipitating element, it is more preferably in a range of 500 at ppm to 1.5 at % with respect to the amount of the intermetallic compound forming element or the high electrode potential element, and desirably in a range of 300 to 1500 at ppm.

Among the above-described fine precipitating elements, C is particularly effective for the fine precipitation of the intermetallic compound or the intermetallic compound forming element. Therefore, it is preferable to use C as the fine precipitating element for the first interconnector line of thin film.

And, H acts on the fine precipitation of the intermetallic compound, the intermetallic compound forming element and the high electrode potential element and on additional improvement of the standard electrode potential of the Al interconnector line of thin film. Therefore, it is preferable to use H as the fine precipitating element for the second interconnector line of thin film. Namely, H lowers an ionization energy possessed by Al, the high electrode potential element and the intermetallic compound itself. Therefore, by using H as the fine precipitating element, the standard electrode potential of the Al interconnector line of thin film can be improved further. Otherwise, the contained amount of the high electrode potential element can be decreased. In addition, H promotes the chemical reaction in wet etching and acceleratingly promotes the reaction between an etching species (radical etc.) and the constituting elements of the Al interconnector line of thin film in dry etching, thereby contributing to improvement of the fine processing accuracy in etching.

But, if H is contained in an excessively large amount, plastic processability or the like of Al might be degraded. Therefore, if H is used as the fine precipitating element, the contained amount of H in the Al interconnector line of thin film is preferably 500 wt ppm or below.

The first interconnector line of thin film of the invention can be obtained by, forming the film by sputtering under general conditions, using for example the Al sputter target having the same composition therewith. And, the second interconnector line of thin film is also obtained in the same way.

Specifically, the sputter target used to form the first interconnector line of thin film comprises 0.001 to 30 at % of at least one type of intermetallic compound forming element constituting an intermetallic compound with Al and 0.01 at ppm to 50 at % with respect to the intermetallic compound forming element of at least one type of fine precipitating element selected from C, O, N and H, with the balance comprising substantially Al. And, the sputter target used to form the second interconnector line of thin film comprises 0.001 to 30 at % of at least one type of high electrode potential element having a standard electrode potential higher than that of Al and 0.01 at ppm to 50 at % with respect to the amount of the high electrode potential element of at least one type of fine precipitating element selected from C, O, N and H, with the balance comprising substantially Al.

The above-described specific contained amounts of the intermetallic compound forming element, the high electrode potential element and the fine precipitating element are as described above. Therefore, the sputter target of the invention can be a sputter target which comprises 0.001 to 30 at % of at least one type of first element (element satisfying at least either the intermetallic compound forming element or the high electrode potential element) selected from, for example, Y, Sc, La, Ce, Nd, Sm, Gd, Tb, Dy, Er, Th, Sr, Ti, Zr, V, Nb, Ta, Cr, Mo, W, Mn, Tc, Re, Fe, Co, Ni, Pd, Ir, Pt, Cu, Ag, Au, Cd, Si, Pb and B and 0.01 at ppm to 50 at % of at least one type of second element (fine precipitating element) selected from C, O, N and H, with the balance comprising substantially Al.

By using such a sputter target, the interconnector line of thin film of the invention can be obtained with good reproducibility. In addition, the fine precipitating element also has an effect of suppressing the amount of dust produced by sputtering. Therefore, the Al interconnector line of thin film which is formed by sputtering using the sputter target of the invention has the contained amount of fine dust decreased substantially, excelling in forming the fine interconnector line network.

And, at least one type of fine precipitating element selected from C, O, N and H can be taken into the Al interconnector line of thin film by controlling, for example, the sputtering atmosphere and conditions. But, it is desirable that it is previously contained into the sputter target to obtain an effect of suppressing the occurred amount of dust by sputtering.

The above-described production method of the sputter target of the invention is not limited to a particular one, and it can be produced by applying a known production method such as atmosphere melting, vacuum melting, quench coagulation (e.g., spray foaming) or powder metallurgy.

For example, when the vacuum melting is applied, an element satisfying at least one of the intermetallic compound forming element and the high electrode potential element and the fine precipitating element such as C are mixed in a predetermined amount with Al, and undergone high-frequency melting in vacuum to produce an ingot. When O, N and H are used as the fine precipitating element, taking into consideration the contained amount as the impurity element, and such gas is bubbled while melting to contain in a given amount into the ingot. When O, N and H are used as the fine precipitating element, it is preferable to adopt the vacuum melting in order to control their contained amount.

And, when the spray foaming is applied, an element satisfying at least either the intermetallic compound forming element or the high electrode potential element and the fine precipitating element are mixed with Al in a given amount in the same way, undergone high-frequency melting, and sprayed by a spray to produce an ingot. When O, N and H are used as the fine precipitating element, taking into account the contained amount as the impurity element, such gas is injected when spraying to contain in a given amount into the ingot.

When the powder metallurgy is applied, the fine precipitating element and an element satisfying at least either the intermetallic compounding forming element or the high electrode potential element are mixed in a given amount with Al, and subjected to atmosphere sintering, hot press, HIP or the like to produce a sinter. When O, N and H are used as the fine precipitating element, N can be contained from $N_2$ atmosphere when the sinter is produced. And, as to O and H, an amount contained in Al mother material is specified. Thus, O, N and H are contained in a predetermined amount into the sinter. Among them, the quench coagulation, by which a high-purity and fine-crystalline material with a relatively high density can be obtained easily, is suitable.

Hot processing or cold processing is generally applied to the ingot obtained by melting and the sinter obtained by powder metallurgy. And, if necessary, recrystallization heat processing and crystal orientation controlling are performed to obtain a desired sputter target. In the case of a large target, diffusion bonding or the like may be performed to obtain a target having a desired shape. But, when a large target which is used to form a large area LCD or the like is produced, it is preferable to form collectively by various types of methods in view of suppressing the occurrence of dust by sputtering.

And, when the sputter target of the invention is produced, it is preferable to have a processing rate of 50% or more by rolling, forging or the like. This is because the heat energy obtained from the above-described processing rate is effective to produce an array of conformed crystal lattices and to decrease fine internal defects. Since the required purity, composition, plane direction and the like are different depending on the desired sputter target, the production method can be determined appropriately according to the required properties.

The production method for the Al interconnector line of thin film of the invention is not limited to the above-described sputtering and can be various types of film forming methods if an Al interconnector line of thin film satisfying the above-described composition can be applied. In other words, the Al interconnector line of thin film of the invention is not limited to the sputter film but can be thin films produced by various types of film forming methods if they are the Al interconnector line of thin films satisfying the above-described composition.

The above-described Al interconnector line of thin film of the invention can be used for interconnector line, electrode and the like of various types of electronic parts. Specifically, they are a liquid crystal display (LCD) using the Al interconnector line of thin film of the invention as the gate line, signal line and the like, and semiconductor devices such as VLSI, ULSI and the like using the Al interconnector line of thin film of the invention as the interconnector line network. Besides, the Al interconnector line of thin film of the invention can also be used for a surface acoustic wave oscillator (SAW) and interconnector line of electronic parts such as an SAW device using the SAW, and a thermal printer head (TPH). The electronic parts of the invention are particularly effective for an enlarged and high-resolution LCD panel and a highly integrated semiconductor device.

Figure 2:
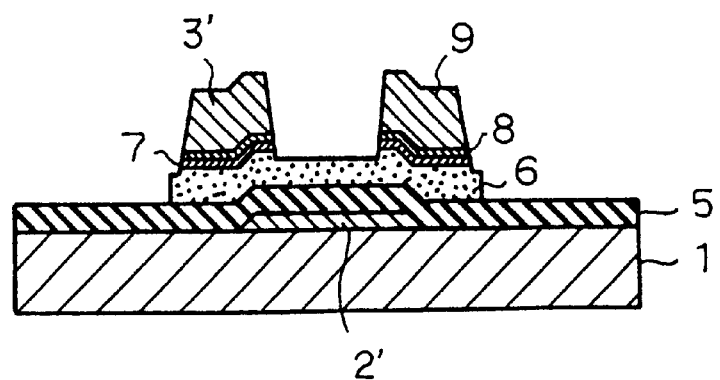
FIG. 2 is a sectional view showing the main structure of the liquid crystal display shown in FIG. 1.

FIG. 1 and FIG. 2 are diagrams showing one embodiment of a liquid crystal display using the Al interconnector line of thin film of the invention. FIG. 1 is an equivalent circuit diagram of an active matrix liquid crystal display using a reverse staggered structure TFT, and FIG. 2 is a sectional view showing the structure of the pertinent TFT.

In FIG. 1, 1 denotes a transparent glass substrate on which gate interconnector line 2 and data interconnector line 3 are disposed into the form of a matrix. A TFT 4 is formed by a-Si film at respective crossings of interconnector line. As shown in FIG. 2, the sectional structure of the TFT 4 has a gate electrode 2' made of the Al interconnector line of thin film (Al alloy film) of the invention formed on the transparent glass substrate 1. This gate electrode 2' is integrally formed by the same material and the same process as the gate electrode 2 of FIG. 1. And, after forming the gate electrode 2', an $Si_3N_4$ film 5 is formed as a gate insulating film thereon, a non-dope a-Si film 6 and an $n^+$ type a-Si film 7 are formed thereon, and an Mo film 8 is formed thereon. Lastly, a drain electrode 3' and a source electrode 9 are formed thereon. A surface electrode 10 and a liquid crystal capacitance 11 of each pixel are connected to the source of the TFT 4.

Figure 3:
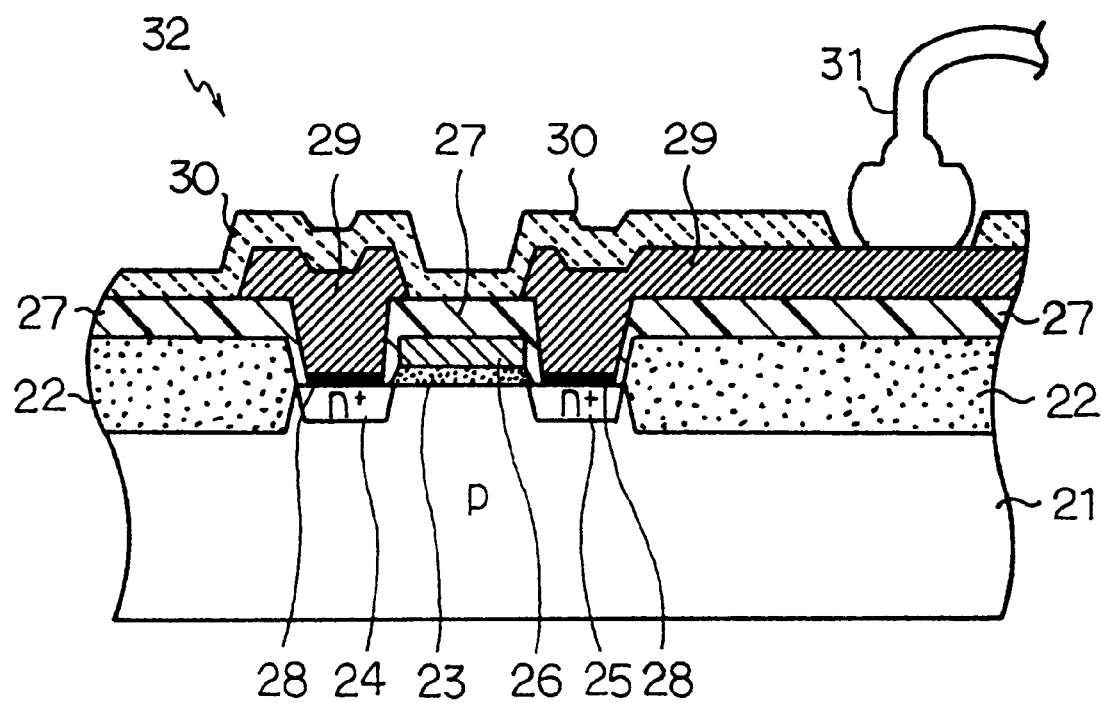
FIG. 3 is a sectional view showing the main structure of one embodiment having an electronic part of the invention applied to a semiconductor device.

FIG. 3 is a sectional view showing the main structure of one embodiment of a semiconductor device using the Al interconnector line of thin film of the invention. The structure of this semiconductor device will be described together with its production process.

In FIG. 3, 21 is a p-Si substrate, and heat oxidation is applied to this p-Si substrate to form a heat-oxidized film on the surface. Then, oxidation treatment is performed selectively excepting each region of source, gate and drain to form a field oxidized film 22. Then, the heat-oxidized film on the respective source and drain regions is removed by the formation of the resist film and etching treatment (PEP treatment). By this PEP treatment, a gate-oxidized film 23 is formed. Then, a resist film is formed excluding the respective source and drain regions, and impurity elements are implanted into the p-Si substrate 21 to form a source region 24 and a drain region 25. And, a silicide film 26 of Mo or W is formed on the gate-oxidized film 23.

Then, after forming an insulation film 27 made of silicate glass or the like on the entire surface of the P-Si substrate 21, the phosphorus silicate glass layer 27 on the source region 24 and the drain region 25 is removed by PEP treatment. A barrier layer 28 of TiN, ZrN, HfN or the like is formed on the source region 24 and the drain region 25 from which the phosphorus silicate glass layer 27 was removed.

Then, the Al interconnector line of thin film (Al alloy film) of the invention is formed on the entire surface, and the PEP treatment is applied to form Al interconnector line 29 having a desired shape. And, after forming an insulation film 30 made of an $Si_3N_4$ film or the like, an opening for bonding an Au lead 31 is formed by the PEP treatment to complete a semiconductor chip 32.

Figure 4:
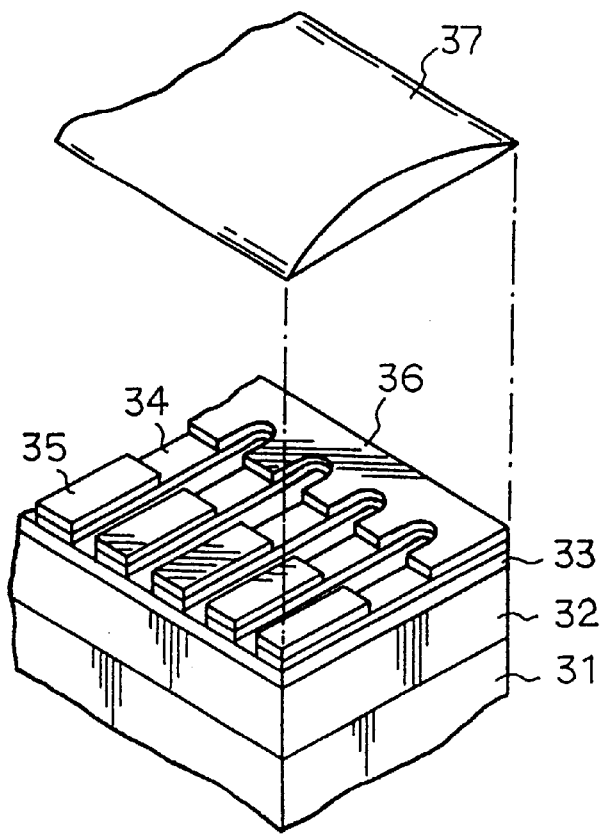
FIG. 4 is a sectional view showing the main structure of one embodiment having an electronic part of the invention applied to a thermal printer head.

FIG. 4 is an exploded perspective view showing the structure of main parts of one embodiment of a thermal printer head using the Al interconnector line of thin film of the invention.

In FIG. 4, a heat-resistant resin layer 32 made of an aromatic polyimide resin or the like is formed on a supporting substrate 31 made of, for example, an Fe—Cr alloy. A base film 33 mainly consisting of, for example, Si and one of N or C is formed on the heat-resistant resin 32 by sputtering or the like. An exothermic resistor 34 and respective electrodes 35 and common electrodes 36 made of the Al interconnector line of thin film of the invention are formed on the base film 33. A protective film 37 is formed to cover most of the electrodes 35, 36 and the exothermic resistor 34.

Figure 5:
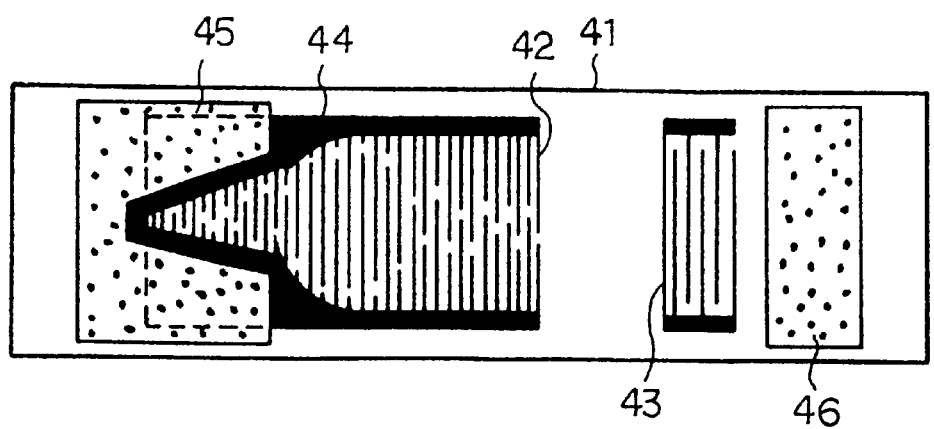
FIG. 5 is a plan view showing the structure of one embodiment having an electronic part of the invention applied to a surface acoustic wave oscillator.
Figure 6:
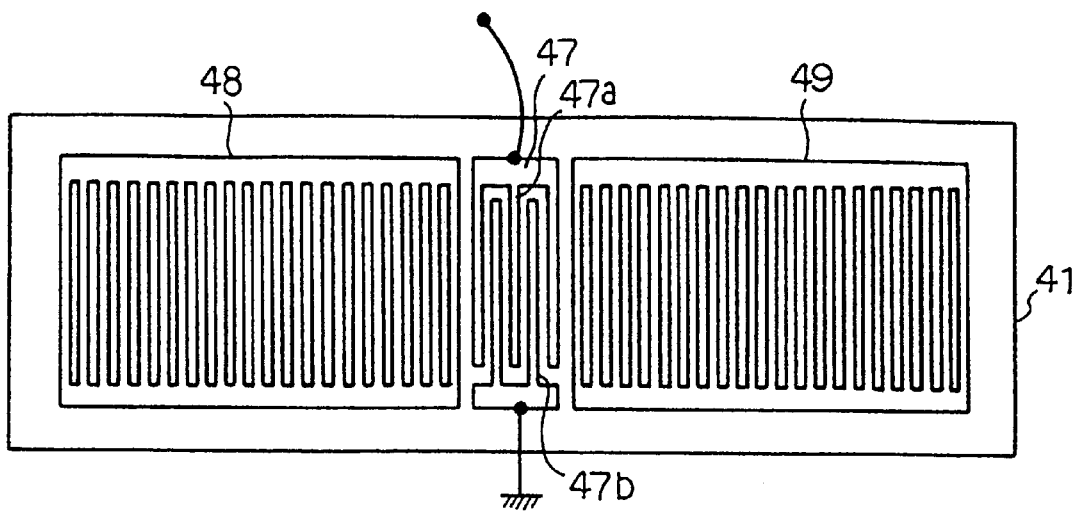
FIG. 6 is a plan view showing the structure of another embodiment having an electronic part of the invention applied to a surface acoustic wave oscillator.
Figure 7:
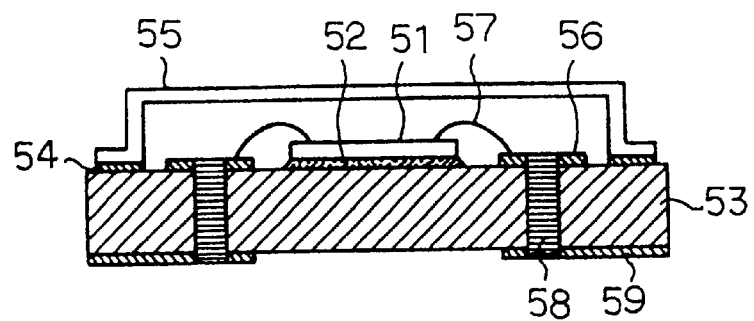
FIG. 7 is a sectional view showing the main structure of an SAW device using a surface acoustic wave oscillator (SAW) shown in FIGS. 5 and 6.

FIG. 5, FIG. 6 and FIG. 7 are diagrams showing an SAW and an SAW device using the Al interconnector line of thin film of the invention. FIG. 5 is a plan view showing the structure of an SAW according to one embodiment, FIG. 6 is a plan view showing the structure of an SAW according to another embodiment, and FIG. 7 is a sectional view showing the structure of an SAW device using the SAW.

In FIG. 5, transducers 42, 43 made of the Al interconnector line of thin film of the invention are formed separately on a piezoelectric substrate 41 made of an $LiTaO_3$ substrate and an $LiNbO_3$ substrate. Weighting is performed to change a crossing width of the electrodes of the transducer, e.g., the input transducer 42, to make a filter, e.g., a PIF filter of a color TV receiver. A non-crossed part of the weighted input transducer 42 is fully covered with the Al alloy film of the invention to make large an electrode terminal 44 of the input transducer 42. A sound absorbing material 45 is disposed in an overlaid form on at least a part of the electrode terminal 44 formed in this way and the outer part of the input transducer 42. The shape of the sound absorbing material 45 is made to have a slanted side edge so to cover most of the rear edge of the input transducer 42 and to cross slantingly with a surface acoustic wave where the incident side of the surface acoustic wave enters. Besides, a sound absorbing material 46 is also disposed on the outer side of the output transducer 43.

And, FIG. 6 is a plan view showing the SAW according to another embodiment. In FIG. 6, a transducer for transforming an input electric signal into a surface acoustic wave propagating on the piezoelectric substrate 41, for example, an interdigital electrode 47 made of a pair of comb-teeth type electrodes 47a and 47b mutually engaged, is formed on a piezoelectric substrate 41 consisting of an $LiTaO_3$ substrate or an $LiNbO_3$ substrate. This interdigital electrode 47 is made of the Al alloy film of the invention. Grading reflectors 48, 49 which is to reflect the surface acoustic wave excited by the interdigital electrode 47, and is made of the Al alloy film of the invention are formed on the piezoelectric substrate 41 at both ends of the interdigital electrode 47.

The SAW shown in FIG. 5 and FIG. 6 is used as a device shown in FIG. 7. In FIG. 7, an SAW 51 is fixed onto a chip carrier 53 made of, for example, a ceramics substrate, through an adhesive member 52, and a metallic cap 55 is put on the chip carrier 53 through a ring 54 made of a low-thermal expansion metal such as Kovar. A interconnector line pattern 56 made of the Al alloy film of the invention is formed on the chip carrier 53. The SAW 51 and the interconnector line pattern 56 are electrically connected by a bonding wire 57. And, the interconnector line pattern 56 (each independent pattern) on the chip carrier 53 is electrically connected to an interconnector line pattern 59 on the bottom side of the chip carrier 53 via a through hole 58 having gold or the like applied on its inner wall and sealed by an insulating material such as glass.

Now, specific embodiments of the Al sputter target and Al interconnector line of thin film of the invention and their evaluated results will be described.

EXAMPLE 1

First, 0.83 at % (2.7 wt %) of Y with respect to Al and 1630 at ppm (220 wt ppm) of C with respect to Y were added to Al, and this mixed material was undergone high-frequency melting to produce an ingot having a target composition. Cold rolling and machining were performed on this ingot to produce an Al sputter target having a diameter of 127 mm and a thickness of 5 mm.

Using the Al sputter target obtained as described above, an Al film having a thickness of 350 nm was formed by spin precipitation on a glass substrate having a diameter of 5 inches under conditions of a back pressure of $1 \times 10^{-4}$ Pa, power of 200W DC and sputter time of 3 min. The Al film was measured to evaluate on a specific resistance, a hillock density after the heat treatment (573 K) and the presence or not of etching residue. Etching for an evaluation test of the etching residue was performed using a $BCl_3 + Cl_2$ mixture gas as etching gas. The results are shown in Table 1.

And, as comparative examples of the present invention, an Al sputter target (comparative example 1-1) produced without adding Y and C and an Al sputter target (comparative example 1-2) produced under the same conditions as Example 1 excepting that C was not added were used to form Al films in the same way by sputtering. And, these Al films were also evaluated for properties in the same way as in Example 1. These results (after the heat treatment) are also shown in Table 1.

TABLE 1

| | Target composition | | Evaluated properties of Al sputter film | | |
|---|---|---|---|---|---|
| | Amount of intermetallic compound forming elements | Amount of C *1 | Specific resistance ($\mu\Omega$ cm) | Hillock density after heat treatment *2 | Etching residue *3 |
| Example 1 | Al-0.83 at % Y | 1630 at. ppm | 3.14 | ◯ | Non |
| Comparative example 1-1 | Al | Non | 3.00 | X | Non |
| Comparative example 1-2 | Al-0.83 at % Y | Non | 3.01 | ◎ | Yes |

*1 Compared with the amount of intermetallic compound forming elements
*2 ◎ = No hillock, ◯ = Side hillocks in part, X = Hillocks on whole surface.
*3 Non = No residue
Yes = Residues on the entire surface It is apparent from Table 1 that the Al interconnector line of thin film of the invention excels in hillock resistance and etching. Thus, by using this Al interconnector line of thin film, a good fine interconnector line network can be formed with good reproducibility.

EXAMPLE 2

After producing the Al sputter targets having respective compositions shown in Table 2 in the same way as in Example 1, sputtering was performed under the same conditions as in Example 1 to produce respective Al interconnector line of thin films. These Al interconnector line of thin films were measured to evaluate their properties in the same way as in Example 1. The results are also shown in Table 2.

TABLE 2

| | Target composition | | Evaluated properties of Al sputter film | | |
|---|---|---|---|---|---|
| Sample No. | Amount of intermetallic compound forming elements (atomic ratio) | Amount of C *1 (atomic ratio) | Specific resistance (µΩ cm) | Hillock density after heat treatment *2 | Etching residue *3 |
| Example 2 | | | | | |
| 1 | Al-071% Y | 5% | 3.5 | ○ | Non |
| 2 | Al-0.73% Y | 12% | 3.8 | ⊚ | Non |
| 3 | Al-1.1% Y | 200 ppm | 4.1 | ⊚ | Non |
| 4 | Al-1.73% Y | 580 ppm | 4.6 | ⊚ | Non |
| 5 | Al-1.2% Y | 7% | 5.1 | ⊚ | Non |
| 6 | Al-2.83% Y | 90 ppm | 6.3 | ⊚ | Non |
| 7 | Al-4% Y | 37.8% | 6.7 | ⊚ | Non |
| 8 | Al-2% Y | 300 ppm | 5.1 | ⊚ | Non |
| 9 | Al-1.8% Y | 1.8 ppm | 4.9 | ○ | Non |
| Comparative example 2 | | | | | |
| 1 | Al-2.3% Y | Non | 4.5 | ⊚ | Yes |
| 2 | Al-4% Y | 55% | 4.9 | ⊚ | Yes |

EXAMPLE 3

After producing Al targets using various types of elements instead of Y (compositions shown in Table 3) in the same way as in Example 1, respective Al interconnector line of thin films were obtained by sputtering under the same conditions as in Example 1.

These Al interconnector line of thin films were measured to evaluate their properties in the same way as in Example 1. And, the Al interconnector line of thin films of sample Nos. 16 through 21 were measured to evaluate reactivity with the ITO electrode in an alkaline solution. Reactivity with the ITO electrode in the alkaline solution was examined by a generally used electrode measuring method using silver/silver chloride electrodes as a reference electrode and ITO as the anode and respective Al alloys as the cathode. The results are also shown in Table 3.

TABLE 3

| | Target composition | | Evaluated properties of Al sputter elements (atomic ratio) | | | |
|---|---|---|---|---|---|---|
| Sample No. | Amount of intermetallic compound forming elements (atomic ratio) | Amount of C *1 (atomic ratio) | Specific resistance (µΩ cm) | Hillock density after heat treatment *2 | Etching residue *3 | Reactivity with ITO *4 |
| Example 3 | | | | | | |
| 1 | Al-1.5% Gd | 2600 ppm | 3.8 | ⊚ | Non | — |
| 2 | Al-2.2% Gd | 3700 ppm | 4.8 | ⊚ | Non | — |
| 3 | Al-2.6% Th | 110 ppm | 4.0 | ⊚ | Non | — |
| 4 | Al-5.3% Th | 70 ppm | 5.2 | ⊚ | Non | — |
| 5 | Al-2.1% Re | 220 ppm | 4.0 | ⊚ | Non | — |
| 6 | Al-1.9% B | 170 ppm | 4.2 | ○ | Non | — |
| 7 | Al-6.1% B | 340 ppm | 5.1 | ⊚ | Non | — |

TABLE 3-continued

| | Target composition | | Evaluated properties of Al sputter elements (atomic ratio) | | | |
|---|---|---|---|---|---|---|
| Sample No. | Amount of intermetallic compound forming elements (atomic ratio) | Amount of C *1 (atomic ratio) | Specific resistance (µΩ cm) | Hillock density after heat treatment *2 | Etching residue *3 | Reactivity with ITO *4 |
| 8 | Al-4.9% Sc | 90 ppm | 4.4 | ○ | Non | — |
| 9 | Al-3.7% Sc | 410 ppm | 5.3 | ⊚ | Non | — |
| 10 | Al-1.6% Nd | 20 ppm | 4.7 | ○ | Non | — |
| 11 | Al-2.3% Dy | 700 ppm | 3.6 | ⊚ | Non | — |
| 12 | Al-1.8% Dy | 12% | 4.3 | ⊚ | Non | — |
| 13 | Al-1.0% Zr-0.2% B | 120 ppm | 3.5 | ⊚ | Non | — |
| 14 | Al-0.8% Hf-0.5% B | 190 ppm | 3.8 | ⊚ | Non | — |
| 15 | Al-1.1% Y-0.9% B | 310 ppm | 4.2 | ⊚ | Non | — |
| 16 | Al-2.6% Cu | 400 ppm | 4.5 | ⊚ | Non | ○ |
| 17 | Al-4.2% Cu | 580 ppm | 5.1 | ⊚ | Non | ○ |
| 18 | Al-0.9% Mn | 350 ppm | 3.4 | ⊚ | Non | ○ |
| 19 | Al-9.7% V | 1600 ppm | 5.6 | ⊚ | Non | ○ |
| 20 | Al-15.1% Mn | 5.1% | 7.9 | ⊚ | Non | Δ |
| 21 | Al-13.2% Ta | 7.5% | 8.8 | ⊚ | Non | Δ |

*4 ○= No reaction, Δ= Reaction in part, X = Reaction.

EXAMPLE 4

First, material having 2.84 at % (6 wt %) of Co added to Al was undergone high-frequency melting (vacuum melting), and $H_2$ gas was bubbled into the melted metal to give H therein. The bubbling amount of H was set so that the amount of H in an ingot becomes 980 at ppm (200 wt ppm) with respect to the amount of Co. The ingot thus produced to have a target composition was undergone hot rolling and machining to obtain an Al sputter target having a diameter of 127 mm and a thickness of 5 mm.

Using the Al sputter target thus produced, an Al film having a thickness of 350 nm was formed by spin precipitation on a glass substrate having a diameter of 5 inches under conditions of a back pressure of $1 \times 10^{-4}$ Pa, power of 200W DC and sputter time of 2 min. The Al film was undergone patterning and dry etching and measured to evaluate on a specific resistance, a hillock density and the presence or not of etching residue after the heat treatment at 573 K. The results are shown in Table 4. The evaluation test of the etching residue was performed using a $BCl_3 + Cl_2$ mixture gas as etching gas.

And, as comparative examples against the invention, an Al sputter target (comparative example 4-1) produced with no addition of Co and H and an Al sputter target (comparative example 4-2) produced under the same conditions excepting no addition of H as in Example 4 were used to form an Al film in the same way by sputtering. And, these Al films were also evaluated on their properties in the same way as in Example 4. These results are also shown in Table 4.

TABLE 4

| | Target composition | | Evaluated properties of Al sputter film | | |
|---|---|---|---|---|---|
| | Amount of added elements (atomic ratio) | Amount of H *1 (atomic ratio) | Specific resistance ($\mu\Omega$ cm) | Hillock density after heat treatment *2 | Etching residue *3 |
| Example 4 | Al-2.84% Co | 980 ppm | 4.3 | ⊚ | Non |
| Comparative example 4-1 | Al | Non | 2.9 | X | Non |
| Comparative example 4-2 | Al-2.84% Co | Non | 4.2 | ○ | Yes |

*1 With respect to the amount of added elements
*2 ⊚ = No hillock, ○ = Side hillocks in part, Δ = Hillocks in part, X = Hillocks on the entire face.
*3 Non = No residue
Yes = Residues on the entire surface As apparent from Table 4, it is clear that the Al interconnector line of thin film of example 4 excels in hillock resistance and etching. Therefore, by using this Al interconnector line of thin film, a good fine interconnector line network can be formed with good reproducibility.

EXAMPLE 5

Figure 8:
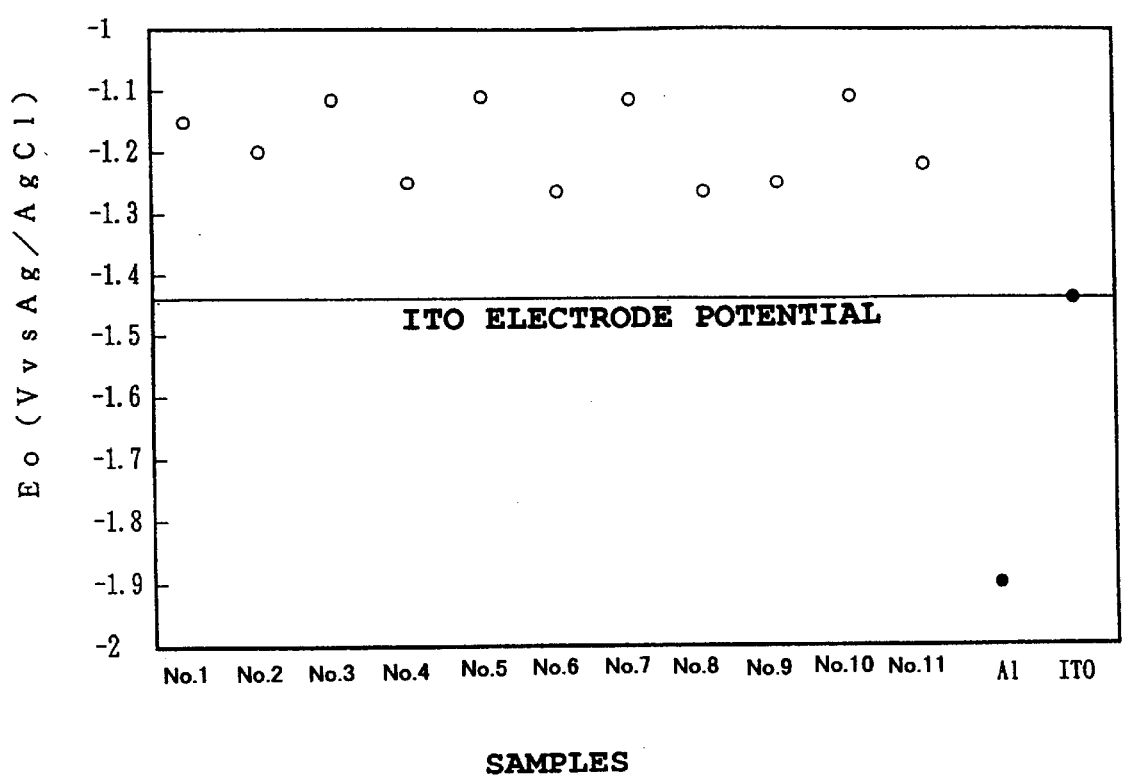
FIG. 8 is a diagram showing electrode potential of a interconnector line of thin film of the invention in comparison with Al and ITO.

After producing Al sputter targets having respective compositions shown in Table 5 in the same way as in Example 4, sputtering was performed to produce films under the same conditions as in Example 4. The respective Al films thus produced were put in an alkaline solution (NMD-3/developing solution) to measure electrode potentials by using a reference electrode (Ag/AgCl/Cl⁻). The results are shown in Table 5 and FIG. 8.

TABLE 5

| | Target composition | | Standard electrode potential (V (vsAg/AgCl)) |
|---|---|---|---|
| Sample No. | Amount of high electrode potential elements | Amount of H *1 | |
| Example 5 | | | |
| 1 | Al-1.43 at % Ni | 3600 at. ppm | -1.15 |
| 2 | Al-1.91 at % Co | 190 at. ppm | -1.2 |
| 3 | Al-2.01 at % Pt | 700 at. ppm | -1.12 |
| 4 | Al-1.87 at % Au | 150 at. ppm | -1.25 |
| 5 | Al-2.3 at % Mo | 920 at. ppm | -1.11 |
| 6 | Al-4.6 at % W | 80 at. ppm | -1.27 |
| 7 | Al-3.8 at % Pd | 610 at. ppm | -1.12 |
| 8 | Al-5.2 at % Ta | 110 at. ppm | -1.27 |
| 9 | Al-3.3 at % Ti | 180 at. ppm | -1.25 |
| 10 | Al-1.2 at % Ag | 700 at. ppm | -1.11 |
| 11 | Al-6.2 at % V | 300 at. ppm | -1.22 |
| Comparative example 5-1 | Al | Non | -1.9 |
| Comparative example 5-2 | (ITO) | — | -1.44 |

*1 With respect to the amount of high electrode potential element

As apparent from Table 5 and FIG. 3, it is seen that the Al film containing an element having a standard electrode potential higher than Al has an electrode potential higher than that of the ITO.

EXAMPLE 6

Using elements (Ir, Pt, V, Nb) having a standard electrode potential higher than Al, the Al sputter targets having the compositions shown in Table 6 were produced in the same way as in Example 4, and films were formed by sputtering under the same conditions as in Example 4 to obtain the Al interconnector line of thin films. These Al interconnector line of thin films were measured to evaluate their reactivity with the ITO electrode in an alkaline solution. The results are also shown in Table 6. Comparative example 6 in Table 6 has the contained amount of high electrode potential elements fell outside the range of the invention.

TABLE 6

| | Target composition | | Evaluated properties of Al sputter film | | | |
|---|---|---|---|---|---|---|
| Sample No. | Added amount of high electrode potential elements (atomic ratio) | Amount of H *1 (atomic ratio) | Specific resistance ($\mu\Omega$ cm) | Hillock density after heat treatment *2 | Etching residue *3 | Reactivity with ITO *4 |
| Example 6 | | | | | | |
| 1 | Al-1.9% Ir | 50 ppm | 4.5 | ⊚ | Non | ○ |
| 2 | Al-2.4% Pt | 17000 ppm | 4.8 | ⊚ | Non | ○ |
| 3 | Al-5.7% V | 39000 ppm | 8.2 | ⊚ | Non | ○ |
| 4 | Al-2.3% Nb | 400 ppm | 5.1 | ⊚ | Non | ○ |
| Comparative example 6 | | | | | | |
| 1 | Al-0.009% Ir | 120 ppm | 2.9 | X | Non | X |
| 2 | Al-32% Ir | 300 ppm | 13.5 | ⊚ | Yes | ○ |
| 3 | Al-0.01% Pt | 900 ppm | 3.1 | Δ | Non | Δ |
| 4 | Al-35% Pt | 20 ppm | 12.5 | ⊚ | Yes | ○ |
| 5 | AL-33% V | 2500 ppm | 19.9 | ⊚ | Yes | ○ |
| 6 | Al-0.05% Nb | 3000 ppm | 3.3 | Δ | Non | X |

As apparent from Table 6, if the contained amount of high electrode potential element is excessively large, specific resistance increases, and the etching residue cannot be prevented even if an appropriate amount of H is contained. On the other hand, if the contained amount of high electrode potential elements is excessively small, the occurrence of hillocks and the reaction with the ITO electrode can not be prevented. Meanwhile, the respective Al interconnector line of thin films having an appropriate amount of high electrode potential elements and H contained according to Example 6 are seen excelling in specific resistance, hillock resistance, etching and resistance of reaction with the ITO electrode. Therefore, by using such an Al interconnector line of thin film, a good fine interconnector line network can be formed with good reproducibility. And, the gate line or the like of the LCD can also be formed properly.

EXAMPLE 7

Using elements (Au, Ag, Pd) having a standard electrode potential higher than Al, the Al sputter targets having the compositions shown in Table 7 were produced in the same way as in Example 4, and films were formed by sputtering under the same conditions as in Example 4 to obtain the Al interconnector line of thin films. These Al interconnector line of thin films were measured to evaluate their properties in the same way as in Example 1. And, the etching property of the Al interconnector line of thin films was examined on the etching rate of wet etching and dry etching respectively. The results are shown in Table 7.

Comparative example 7 in Table 7 shows Al films formed by sputtering in the same way respectively using the Al sputter target produced in the same conditions as Example 7 excepting that H was not added.

TABLE 7

| | Target composition | | Evaluated properties of Al sputter film | | | |
|---|---|---|---|---|---|---|
| Sample No. | Added amount of high electrode potential elements (atomic ratio) | Amount of H (atomic ratio) (target/wt ppm) | Specific resistance (μΩ cm) | Hillock density after heat treatment *2 | Wet etching rate (nm/min) | Dry etching rate (nm/min) |
| Example 7 | | | | | | |
| 1 | Al-0.2% Au | 163 ppm (450 ppm) | 3.1 | ⊚ | 105 | 380 |
| 2 | Al-0.9% Ag | 354 ppm (380 ppm) | 4.2 | ⊚ | 111 | 400 |
| 3 | Al-1.2% Pd | 580 ppm (480 ppm) | 4.6 | ⊚ | 101 | 340 |
| Comparative example 7 | | | | | | |
| 1 | Al-0.7% Au | — | 3.1 | Δ | 75 | 210 |
| 2 | Al-2.5% Ag | — | 4.8 | Δ | 70 | 250 |
| 3 | Al-19% Pd | — | 13.2 | ⊚ | 55 | 200 |

As apparent from Table 7, each Al interconnector line of thin film according to Example 7 containing an appropriate amount of high electrode potential element and H excels in specific resistance and anti-hillock property and also has high etching rate property. Therefore, by using this Al interconnector line of thin film, a good fine interconnector line network can be formed with good reproducibility and high efficiency.

EXAMPLE 8

After producing the Al sputter targets having the compositions shown in Table 8 in the same way as in Example 4, films were formed by sputtering under the same conditions as in Example 4 to obtain the respective Al interconnector line of thin films. The properties of these Al interconnector line of thin films were measured to evaluate in the same way as in Example 1. The results are shown in Table 8.

TABLE 8

| | Target composition | | Evaluated properties of Al sputter film | | |
|---|---|---|---|---|---|
| Sample No. | Amount of intermetallic compound forming amount (atomic ratio) | Amount of H *1 (atomic ratio) | Specific resistance (μΩ cm) | Hillock density after heat treatment *2 | Etching residue *3 |
| Example 8 | | | | | |
| 1 | Al-1.4% Y | 300 ppm | 5.4 | ⊚ | Non |
| 2 | Al-3.2% Zr | 50 ppm | 6.9 | ⊚ | Non |
| 3 | Al-2.1% La | 720 ppm | 4.8 | ⊚ | Non |

TABLE 8-continued

| | Target composition | | Evaluated properties of Al sputter film | | |
|---|---|---|---|---|---|
| Sample No. | Amount of intermetallic compound forming amount (atomic ratio) | Amount of H *1 (atomic ratio) | Specific resistance (μΩ cm) | Hillock density after heat treatment *2 | Etching residue *3 |
| 4 | Al-11% Ce | 400 ppm | 8.8 | ⊚ | Non |
| 5 | Al-7.9% Nd | 190 ppm | 6.5 | ⊚ | Non |
| 6 | Al-2.2% Nd | 300 ppm | 5.3 | ⊚ | Non |
| 7 | Al-2.8% Nd | 800 ppm | 5.7 | ○ | Non |
| Comparative example 8 | | | | | |
| 1 | Al-45% Y | 210 ppm | 28.4 | ⊚ | Yes |
| 2 | Al-2.2% Zr | 0.004 ppm | 3.9 | ⊚ | Yes |
| 3 | Al-51% La | 30 ppm | 31.2 | ⊚ | Yes |
| 4 | Al-0.0005% Ce | 7500 ppm | 3.1 | X | Non |
| 5 | Al-80% Nd | 15 ppm | 41.3 | ⊚ | Yes |

EXAMPLE 9

First, material having 0.3 at % (2 wt %) of Ta added to Al was undergone high frequency melting (vacuum melting), and $O_2$ was bubbled to enter oxygen when melting. The entered amount of oxygen was set so that the amount of O in an ingot becomes 10 at ppm (300 wt ppm) with respect to the amount of Ta. The ingot thus produced to have a target composition was undergone hot rolling and machining to obtain an Al sputter target having a diameter of 127 mm and a thickness of 5 mm.

Using the Al sputter target thus produced, an Al film having a thickness of 350 nm was formed by spin precipitation on a glass substrate having a diameter of 5 inches under conditions of a back pressure of $1\times10^{-4}$ Pa, power of 200W DC and sputter time of 2 min. The Al film was undergone patterning and dry etching and measured to evaluate on a specific resistance, a hillock density and the presence or not of etching residue after the heat treatment at 573 K. The results are shown in Table 9. The evaluation test of the etching residue was performed using a BCl3+Cl2 mixture gas as etching gas.

And, as comparative examples with the invention, an Al sputter target (comparative example 9-1) produced with no addition of Ta and O and an Al sputter target (comparative example 9-2) produced under the same conditions excepting no addition of O as in Example 9 were used to form an Al film in the same way by sputtering. And, these Al films were also evaluated on their properties in the same way as in Example 9. These results are also shown in Table 9.

TABLE 9

| | Target composition | | Evaluated properties of Al sputter film | | |
|---|---|---|---|---|---|
| | Added amount of elements | Amount of O *1 | Specific resistance (μΩ cm) | Hillock density after heat treatment *2 | Etching residue *3 |
| Example 9 | Al-0.3 at % Ta | 10 ppm | 3.3 | ⊚ | Non |

TABLE 9-continued

|  | Target composition | | Evaluated properties of Al sputter film | | |
|---|---|---|---|---|---|
|  | Added amount of elements | Amount of O *1 | Specific resistance (μΩ cm) | Hillock density after heat treatment *2 | Etching residue *3 |
| Comparative example 9-1 | Al | Non | 3.1 | X | Non |
| Comparative example 9-2 | Al-0.3 at % Ta | Non | 3.2 | ⊙ | Yes |

As apparent from Table 9, it is seen that the Al interconnector line of thin film of Example 9 excels in anti-hillock property and etching property. Therefore, by using this Al interconnector line of thin film, a good fine interconnector line network can be formed with good reproducibility.

EXAMPLE 10

Al targets (compositions shown in Table 10) using various types of elements were produced in the same way as in Example 9, films were formed by sputtering under the same conditions as in Example 9 to obtain respective Al interconnector line of thin films.

These Al interconnector line of thin films were measured to evaluate their properties in the same way as in Example 1. And, the Al interconnector line of thin films of sample Nos. 5 and 6 were also measured to evaluate their reactivity with the ITO electrode in an alkaline solution in the same way as in Example 3. The results are shown in Table 10. Comparative example 10 in Table 10 had the added amounts of elements falling outside of the range of the invention.

TABLE 10

| | Target composition | | Evaluated properties of Al sputter elements (atomic ratio) | | | |
|---|---|---|---|---|---|---|
| Sample No. | Amount of intermetallic compound forming elements (atomic ratio) | Amount of O *1 (atomic ratio) | Specific resistance (μΩ cm) | Hillock density after heat treatment *2 | Etching residue *3 | Reactivity with ITO *4 |
| Example 10 | | | | | | |
| 1 | Al-1.1% Er | 190 ppm | 4.7 | ⊙ | Non | — |
| 2 | Al-23% Th | 70 ppm | 16.5 | ⊙ | Non | — |
| 3 | Al-19.2% Sr | 920 ppm | 17.3 | ⊙ | Non | — |
| 4 | Al-1.4% Zr | 90 ppm | 4.2 | ⊙ | Non | — |
| 5 | Al-1.2% Si | 130 ppm | 4.6 | ⊙ | Non | ○ |
| 6 | Al-1.7% Ti | 250 ppm | 5.3 | ⊙ | Non | ○ |
| 7 | Al-0.9% Ti | 90 ppm | 4.1 | ⊙ | Non | — |
| 8 | Al-0.7% Ti | 5000 ppm | 4.3 | ⊙ | Non | — |
| Comparative example 10 | | | | | | |
| 1 | Al-36.5% Er | 20 ppm | 18.2 | ⊙ | Yes | — |
| 2 | Al-0.4% Th | 0.007 ppm | 3.2 | ○ | Yes | — |
| 3 | Al-0.6% Sr | 0.003 | 3.9 ppm | ○ | Yes | — |
| 4 | Al-38.1% Zr | 340 ppm | 23.6 | ⊙ | Yes | — |
| 5 | Al- | 29000 | 3.4 | X | Non | Δ |
| 6 | Al-0.0005% Si Al-32.8% Ti | 450 ppm | 26.5 | ⊙ | Yes | ○ |

EXAMPLE 11

First, material having 0.28 at % (2 wt %) of Pt added to Al underwent high-frequency melting (vacuum melting) and $N_2$ was bubbled to enter nitrogen while melting. The entered amount of nitrogen was determined so that the amount of N in an ingot becomes 19 at ppm (500 wt ppm) against the amount of Pt. The ingot produced to have the target composition was undergone hot rolling and machining to obtain an Al sputter target having a diameter of 127 mm and a thickness of 5 mm.

Using the Al sputter target thus obtained, an Al film having a thickness of 350 mm was formed by spin precipitation on a glass substrate having a diameter of 5 inches under conditions of a back pressure of $1\times10^{-4}$ Pa, power of 200W DC and sputter time of 2 min. The Al film was undergone patterning and dry etching and measured to evaluate on a specific resistance, a hillock density and the presence or not of etching residue after the heat treatment at 573 K. The results are shown in Table 11. The evaluation test of the etching residue was performed using a $BCl_3+Cl_2$ mixture gas as etching gas.

As comparative examples of the invention, an Al sputter target (Comparative example 11-1) produced with no addition of Pt and N and an Al sputter target (Comparative example 11-2) produced under the same conditions as in Example 11 excepting that N was not added were used to form Al films by sputtering in the same way. And, these Al films were also evaluated on their properties in the same way as in Example 11. These results are also shown in Table 11.

TABLE 11

| | Target composition | | Evaluated properties of Al sputter film | | |
|---|---|---|---|---|---|
| | Added amount of elements | Amount of N *1 | Specific resistance (μΩ cm) | Hillock density after heat treatment *2 | Etching residue *3 |
| Example 11 | Al-0.28 at % | 19 ppm | 3.4 | ⊙ | Non |
| Comparative example 11-1 | Al | Non | 3.1 | X | Non |
| Comparative example 11-2 | Al-0.28 at % | Non | 3.2 | ○ | Yes |

As apparent from Table 11, it is seen that the Al interconnector line of thin film of Example 11 excels in anti-hillock property and etching property. Therefore, by using this Al interconnector line of thin film, a good fine interconnector line network can be formed with good reproducibility.

EXAMPLE 12

After producing Al targets using various types of elements (compositions shown in Table 12) in the same way as in Example 11, respective Al interconnector line of thin films were obtained by making films by sputtering under the same conditions as in Example 11. These Al interconnector line of thin films were measured to evaluate their properties by the same procedure as in Example 1. Comparative example 12 in Table 12 had the added amount of element determined falling outside the range of the invention.

TABLE 12

| | Target composition | | Evaluated properties of | | |
| --- | --- | --- | --- | --- | --- |
| | Amount of | | Al sputter film | | |
| Sample No. | intermetallic compound forming elements (atomic ratio) | Amount of N *1 (atomic ratio) | Specific resistance (μΩ cm) | Hillock density after heat treatment *2 | Etching residue *3 |
| Example 12 | | | | | |
| 1 | Al-1.8% Sc | 660 ppm | 4.7 | ◎ | Non |
| 2 | Al-2.2% La | 330 ppm | 4.4 | ◎ | Non |
| 3 | Al-1.3% Ce | 910 ppm | 4.9 | ◎ | Non |
| 4 | Al-2.4% Nd | 420 ppm | 5.1 | ◎ | Non |
| 5 | Al-2.8% Sm | 70 ppm | 5.7 | ◎ | Non |
| 6 | Al-3.0% Gd | 150 ppm | 5.4 | ◎ | Non |
| 7 | Al-4.5% Tb | 220 ppm | 5.9 | ◎ | Non |
| 8 | Al-11% Dy | 290 ppm | 6.3 | ◎ | Non |
| 9 | Al-1.2% Sc | 3000 ppm | 4.6 | ◎ | Non |
| 10 | Al-1.3% Sc | 800 ppm | 4.8 | ◎ | Non |
| Comparative example 12 | | | | | |
| 1 | Al-32% Sc | 310 ppm | 18.9 | ◎ | Yes |
| 2 | Al-31% La | 700 ppm | 27.8 | ◎ | Yes |
| 3 | Al-0.0008% Ce | 6000 ppm | 3.5 | X | Non |
| 4 | Al-0.0007% Nd | 3200 ppm | 3.2 | X | Non |
| 5 | Al-34% Sm | 3000 ppm | 21.2 | ◎ | Yes |
| 6 | Al-36% Gd | 7400 ppm | 22.6 | ◎ | Yes |
| 7 | Al-21% Tb | 0.003 ppm | 19.9 | ◎ | Yes |
| 8 | Al-26% Dy | 0.005 ppm | 25.6 | ◎ | Yes |

Industrial Applicability

As apparent from the above-described examples, the interconnector line of thin film of the invention has low resistance and also excels in anti-hillock property, etching property, preventing property of an electrochemical reaction with ITO or the like. Therefore, by using the interconnector line of thin film of the invention, LCD's signal lines, gate lines, and very fine interconnector line network of a semiconductor device can be formed well. And, with the sputter target of the invention, the above-described low resistance interconnector line of thin film can be formed with good reproducibility, and the occurrence of dust in sputtering can be suppressed.

What is claimed is:

1. A sputter target, consisting essentially of 0.001 to 30 at % of at least one first element constituting an intermetallic compound of Al, 0.01 at ppm to 50 at %, with respect to the amount of the first element, of at least one second element selected from the group consisting of C, O, N and H, provided that an amount of N is not more than 3000 at ppm, and the balance of Al.

2. A sputter target, consisting essentially of 0.001 to 30 at % of at least one first element having a standard electrode potential higher than Al, 0.01 at ppm to 50 at %, with respect to the amount of the first element, of at least one second element selected from the group consisting of C, O, N and H, provided that an amount of N is not more than 3000 at ppm, and the balance of Al.

3. The sputter target according to claim 2, wherein the sputter target has the first element which is an element constituting an intermetallic compound of Al.

4. A sputter target consisting essentially of 0.001 to 30 at % of at least one first element having a standard electrode potential higher than Al, 0.01 at ppm to 50 at % of H with respect to the amount of the first element, and the balance of Al.

5. The sputter target according to claim 4, wherein the sputter target contains the H in a range of 500 wt ppm or below.

6. A sputter target, consisting essentially of at least one first element selected from Y, Sc, La, Ce, Nd, Sm, Gd, Tb, Dy, Er, Th, Sr, Ti, Zr, V, Nb, Ta, Cr, Mo, W, Mn, Tc, Re, Fe, Co, Ni, Pd, Ir, Pt, Cu, Ag, Au, Cd, Si, Pb and B, 0.01 at ppm to 50 at %, with respect to the amount of the first element, of at least one second element selected from the group consisting of C, O, N and H, provided that an amount of N is not more than 3000 at ppm, and the balance of Al.

* * * * *